US011824025B2

(12) United States Patent
Zhou et al.

(10) Patent No.: US 11,824,025 B2
(45) Date of Patent: Nov. 21, 2023

(54) APPARATUS INCLUDING INTEGRATED PADS AND METHODS OF MANUFACTURING THE SAME

(71) Applicant: Micron Technology, Inc., Boise, ID (US)

(72) Inventors: Wei Zhou, Boise, ID (US); Thiagarajan Raman, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/408,343

(22) Filed: Aug. 20, 2021

(65) Prior Publication Data

US 2023/0056579 A1 Feb. 23, 2023

(51) Int. Cl.
H01L 23/00 (2006.01)
H01L 21/56 (2006.01)
H01L 23/29 (2006.01)
H01L 23/433 (2006.01)

(52) U.S. Cl.
CPC .............. H01L 24/06 (2013.01); H01L 21/56 (2013.01); H01L 23/296 (2013.01); H01L 23/4334 (2013.01); H01L 24/03 (2013.01); H01L 24/05 (2013.01); H01L 2224/05091 (2013.01); H01L 2224/06519 (2013.01); H01L 2924/35121 (2013.01)

(58) Field of Classification Search
CPC ....... H01L 24/06; H01L 21/56; H01L 23/296; H01L 23/4334; H01L 24/03; H01L 24/05; H01L 2224/05091; H01L 2224/06519; H01L 2924/35121

USPC .................. 257/773; 438/618, 666
See application file for complete search history.

(56) References Cited

U.S. PATENT DOCUMENTS

| 2009/0079094 A1 | 3/2009 | Lin | |
| 2011/0095436 A1* | 4/2011 | Chen | H01L 23/481 257/E21.597 |
| 2014/0162449 A1* | 6/2014 | An | H01L 21/76885 438/613 |
| 2018/0204797 A1 | 7/2018 | Lin et al. | |

FOREIGN PATENT DOCUMENTS

| TW | 200841460 A | 10/2008 |
| TW | 200915455 A | 4/2009 |
| TW | 201712837 A | 4/2017 |

OTHER PUBLICATIONS

TW Patent Application No. 111126586—Taiwanese Office Action and Search Report, dated May 4, 2023, with English Translation, 18 pages.

* cited by examiner

*Primary Examiner* — Didarul A Mazumder
(74) *Attorney, Agent, or Firm* — Perkins Coie LLP

(57) ABSTRACT

Semiconductor devices including electrically-isolated extensions and associated systems and methods are disclosed herein. An electrically-isolated extension may be coupled to a corresponding connection pad that is attached to a surface of a device. The electrically-isolated extensions may extend at least partially through one or more layers at or near the surface and toward a substrate or an inner portion thereof.

20 Claims, 7 Drawing Sheets

APPARATUS INCLUDING INTEGRATED PADS AND METHODS OF MANUFACTURING THE SAME

TECHNICAL FIELD

The present technology is directed to apparatuses, such as semiconductor devices including memory and processors, and several embodiments are directed to semiconductor devices that include connection pads.

BACKGROUND

The current trend in semiconductor fabrication is to manufacture smaller and faster devices with a higher density of components for computers, cell phones, pagers, personal digital assistants, and many other products. However, decrease in circuit size can lead to changes or weaknesses in structural integrity. For example, structures in the fabricated semiconductor device may delaminate and/or crack due to stress, temperature fluctuations, and/or mismatches in the coefficient of thermal expansion (CTE) for the corresponding materials of the structures in the device.

DETAILED DESCRIPTION

Figure 1A:
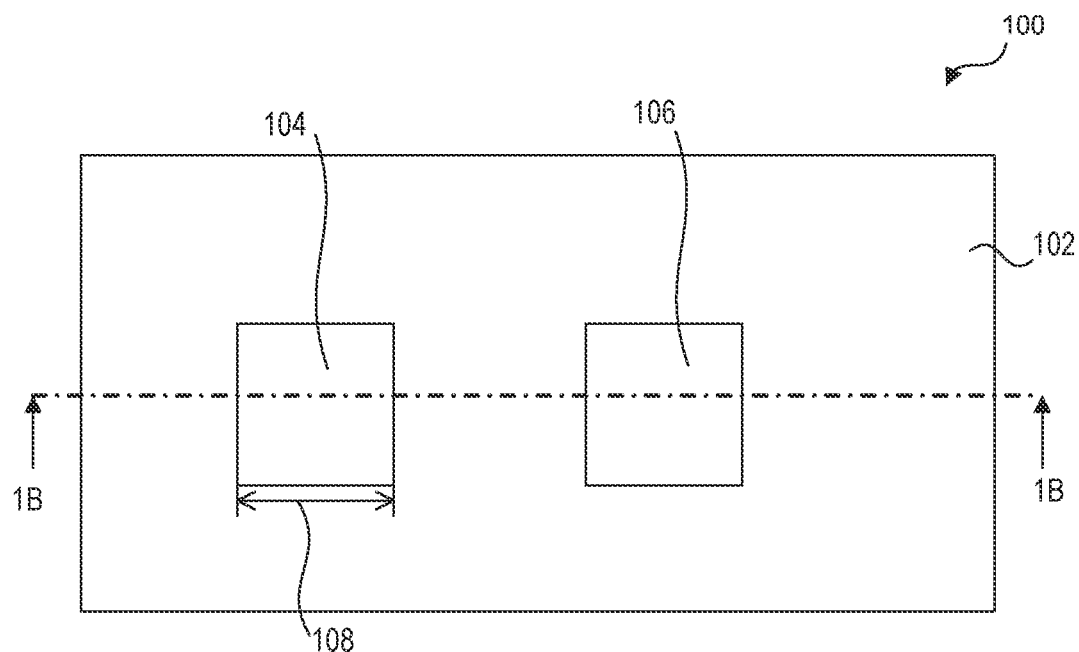
FIG. 1A illustrates a bottom view of an apparatus in accordance with embodiments of the technology.

In the following description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with semiconductor devices are not shown, or are not described in detail, to avoid obscuring other aspects of the technology. In general, it should be understood that various other devices, systems, and methods in addition to those specific embodiments disclosed herein may be within the scope of the present technology.

Several embodiments of semiconductor devices, packages, and/or assemblies in accordance with the present technology can include one or more electrically-isolated extensions (e.g., metallic structures, such as pegs, nails, spikes, nails, or the like) extending vertically inward from one or more pads (e.g., under-bump metallization (UBM), such as electrically-active pads, electrically-isolated pads, and/or thermal pads). The electrically-isolated extensions and the corresponding pads can be electrically isolated and disconnected from electrical circuits on the corresponding apparatus. Each electrically-isolated extension can extend vertically inward from a corresponding pad. For example, an apparatus (e.g., a semiconductor device, a package, and/or an assembly) can include a set of connection pads on a surface (e.g., a bottom surface) thereof. The electrically-isolated extension can be overlapped or hidden by a corresponding pad and extend upward or inward toward an inner portion of the apparatus. The electrically-isolated extension can extend at least partially through a passivation layer (e.g., a tetraethyl orthosilicate (TEOS) layer). In some embodiments, the electrically-isolated extension can extend completely through the passivation layer up to or at least partially through a barrier layer (e.g., a silicon nitride (SiN) layer) adjacent to or abutting the passivation layer.

The electrically-isolated extension can have a width that is less than one or more dimensions of the corresponding pad. In other words, the external portions of the pad can overhang or extend past external edges of the electrically-isolated extension. The electrically-isolated extension can have a length that is less than a distance measured between the inactive surface to the nearest distribution layer. For example, the electrically-isolated extensions can have the length that is less than lengths of through-silicon vias (TSVs). In some embodiments, the electrically-isolated extension length can be less than or up to a distance between the inactive surface to an apparatus/silicon substrate. In other embodiments, the electrically-isolated extension can extend partially into the apparatus substrate.

The electrically-isolated extension provides increased thermal dissipation for the apparatus. The electrically-isolated extension can include material (e.g., metallic material) that has better thermal conductivity than outer layers (e.g., the barrier layer and/or the passivation layer) of the apparatus. Accordingly, the electrically-isolated extension can increase the amount of thermal energy that is drawn out or removed through the corresponding pad (e.g., a thermal pad). The electrically-isolated extension can further improve the structural integrity of the apparatus. The electrically-isolated extension can increase the bond between the corresponding pad and the adjacent layer (e.g., the passivation/TEOS layer) and/or the rigidity in the corresponding portion. Accordingly, the electrically-isolated extension can reduce cracks or other structural failures in the adjacent layer.

Figure 1B:
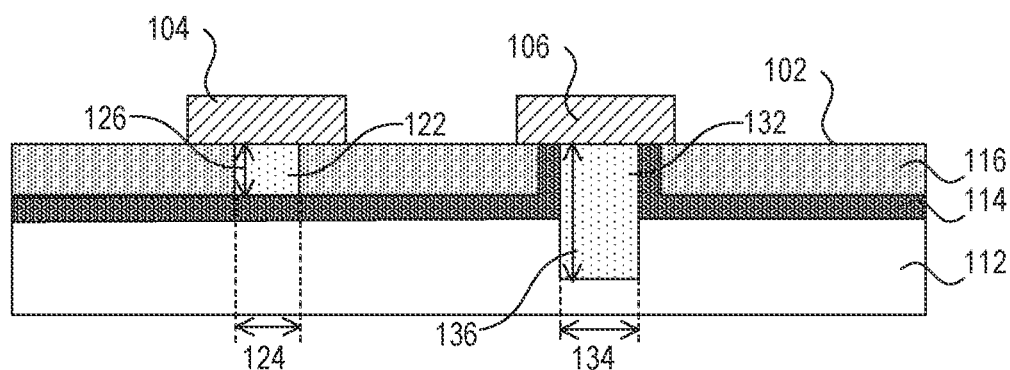
FIG. 1B illustrates a schematic cross-sectional view of the semiconductor device taken along a line 1B-1B of FIG. 1A in accordance with embodiments of the technology.

FIG. 1A is a bottom view of an apparatus 100 (e.g., a semiconductor device, such as a chip, a package, and/or an assembly), and FIG. 1B is a schematic cross-sectional view of the apparatus 100 taken along a line 1B-1B of FIG. 1A in accordance with embodiments of the technology. Referring to FIG. 1A and FIG. 1B together, the apparatus 100 can include a surface 102 (e.g., a bottom surface) with a set of connection pads (e.g., UBMs). As an illustrative example, the apparatus 100 can have a thermal pad 104 and/or an electrical pad 106 disposed over the surface 102. One or more of the pads, such as the thermal pad 104, can have a dimension 108 (e.g., a width).

The apparatus 100 can have a substrate 112 (e.g., a wafer substrate, such as a silicon substrate). The apparatus 100 can have a barrier layer 114 (e.g., a SiN layer) disposed between the substrate 112 and a passivation layer 116 (e.g., a TEOS layer). The barrier layer 114 can overlap or cover the substrate 112 along a lateral plane. The barrier layer 114 may include a dielectric layer to electrically insulate one or more structures (e.g., metal layers, connectors, circuitry, or the like). The barrier layer 114 may also be configured to provide a barrier against chemicals (e.g., etching agents) and/or elements (e.g., water molecules, sodium ions, etc.). The passivation layer 116 can overlap the substrate 112 and function as an electrical and/or a physical barrier. In some embodiments, the passivation layer 116 can function as a solder resist. The passivation layer 116 can have an exposed surface that corresponds to the surface 102 (e.g., the exposed surface of the apparatus 100 or the overall semiconductor substrate structure).

The apparatus 100 can include one or more electrically-isolated extensions 122 (e.g., structures, such as pegs, nails, spikes, nails, or the like) directly coupled to and extending from corresponding pad(s) toward an inner portion of the apparatus 100. For the example illustrated in FIG. 1B, the electrically-isolated extension 122 can include thermally conductive material (e.g., metallic material, such as copper) and extend along a vertical direction (e.g., inwardly or downward in FIG. 1B) from a pad (e.g., the thermal pad 104) toward the substrate 112. The electrically-isolated extension 122 can be electrically isolated from circuits on the apparatus 100. For example, the electrically-isolated extension 122 can be coupled (e.g., thermally, such as through direct contact and/or a thermally interfacing material) to the thermal pad 104.

The electrically-isolated extension 122 can have an extension width 124 and an extension length 126. The extension width 124 can be is less than the pad width 108. The electrically-isolated extension 122 can be overlapped or be covered by the corresponding pad (e.g., the thermal pad 104). In other words, external portions of the coupled pad can overhang or laterally extend past external edges of the electrically-isolated extension 122. The extension length 126 can be less than a separation distance from the surface 102 and an electrical circuit component in the apparatus 100. The electrically-isolated extension 122 can extend at least partially into the passivation layer 116, the barrier layer 114, and/or the substrate 112. For the example illustrated in FIG. 1B, the electrically-isolated extension 122 can extend through the TEOS layer and up to the SiN layer disposed between the TEOS layer and the silicon substrate. The electrically-isolated extension 122 (e.g., peripheral surfaces thereof) can directly contact the barrier layer 114.

The apparatus 100 can include one or more TSVs 132 coupled to the electrical pads 106. The TSV 132 can include an electrically conductive structure (e.g., a copper peg, nail, spike, or the like) that extends vertically and at least partially into the substrate 112 of the apparatus 100. The TSV 132 can electrically couple the corresponding electrical pad 106 to electrical circuit within the apparatus 100.

The TSV 132 can be overlapped by and electrically coupled to the corresponding electrical pad 106. In some embodiments, the TSV 132 can extend through an opening in the passivation layer 116. For example, peripheral surface(s) of the TSV 132 can directly contact the passivation layer 116 that occupy the opening in the passivation layer 116. In some embodiments, the opening can have a width or a dimension that is less than the pad width 108. Also, the TSV 132 may further have a via width 134 that is less than the width of the opening and/or the pad width 108. The TSV 132 can have a via length 136 that corresponds to the electrical coupling. The via length 136 can be greater than the extension length 126.

Figure 2:
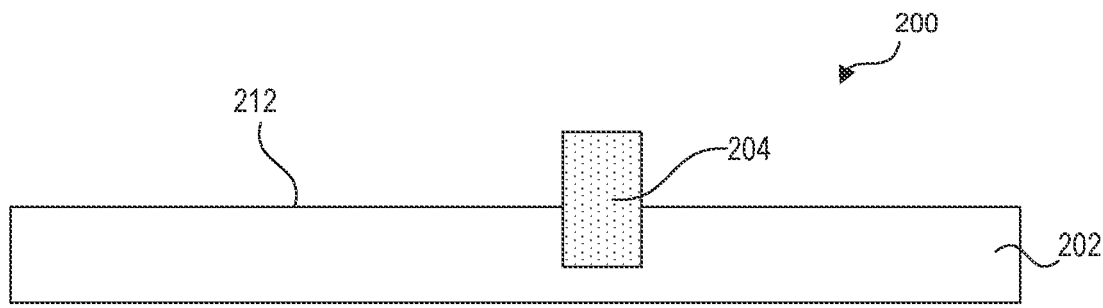
FIG. 2-FIG. 7 illustrate example phases for a manufacturing process in accordance with embodiments of the technology.

FIG. 2-FIG. 7 illustrate example phases for a manufacturing process in accordance with embodiments of the technology. The example phases can correspond to manufacturing the apparatus 100 of FIG. 1A. FIG. 2 illustrates an intermediate structure 200 having a wafer-level substrate 202 (e.g., the substrate 112) and a TSV structure 204. The TSV structure 204 can correspond to the TSV 132 of FIG. 1A, and the wafer-level substrate 202 can correspond to the substrate 112 of FIG. 1B.

The wafer-level substrate 202 can have an uncovered surface 212. The TSV structure 204 can extend below the uncovered surface 212 and partially into the wafer-level substrate 202. The intermediate structure 200 can correspond to a phase after processing of the wafer-level substrate 202. For example, the intermediate structure 200 can correspond to circuit formation (e.g., doping) on the wafer-level substrate 202, grinding/thinning the silicon substrate, forming one or more patterning structures, creating voids in the patterning structures and/or the device wafer, filling (via, e.g., metal deposition/plating) the voids with metallic material, and/or etching away protective or patterning layers.

Figure 3:
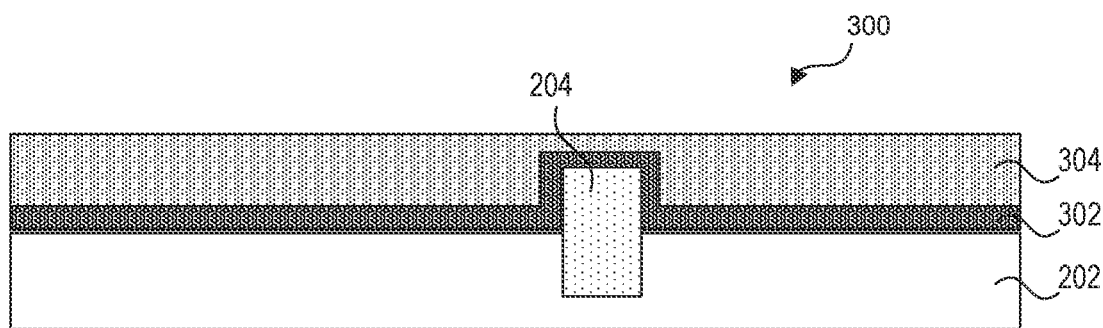

FIG. 3 illustrates an intermediate structure 300 having the structure 200 of FIG. 2 covered with a barrier layer 302 and a passivation layer 304. The barrier layer 302 can correspond to the barrier layer 114 of FIG. 1B, and the passivation layer 304 can correspond to the passivation layer 116 of FIG. 1B. For example, the barrier layer 114 can include a SiN layer, and the passivation layer 116 can include a TEOS layer.

In some embodiments, the manufacturing process can include depositing the barrier layer 302 onto the structure 200 (e.g., directly onto the uncovered surface 212 of FIG. 2) and then depositing the passivation layer 304 over the barrier layer 302. For example, the barrier layer 302 and the passivation layer 304 can be deposited using corresponding chemical deposition and/or lamination processes. The barrier layer 302 can have a thickness less than a protrusion height of the TSV structure 204. The barrier layer 302 can surround and/or conform to a portion of the TSV structure 204 protruding above the wafer-level substrate 202. The passivation layer 304 may be applied with a thickness that covers a top portion of the TSV structure 204 and/or a corresponding portion of the barrier layer 302 over the top portion of the TSV structure 204. The passivation layer 304 may be planarized.

Figure 4:
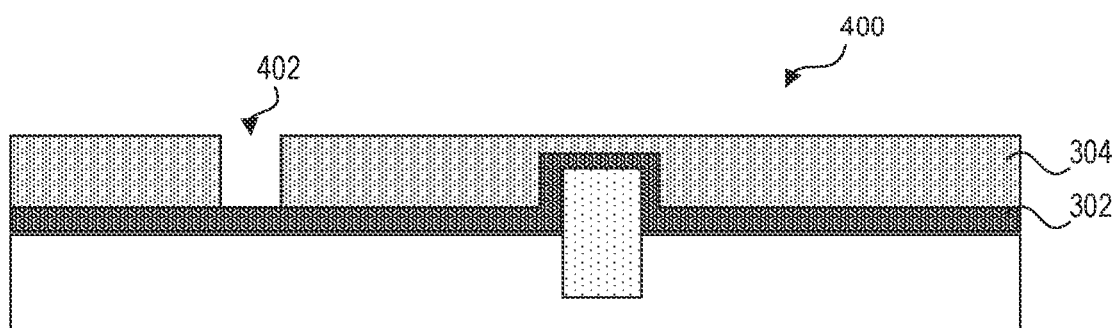

FIG. 4 illustrates an intermediate structure 400 having the structure 300 of FIG. 3 with one or more extension openings/depressions 402 on a top surface thereof. The manufacturing process can include removal (using, e.g., chemical etching and/or mechanical removal techniques) of a portion of the passivation layer 304 at a predetermine location and/or depth to form each of the extension openings 402. For example, the extension openings 402 can be formed with dimensions corresponding to the extension width 124 of FIG. 1B and/or the extension length 126 of FIG. 1B. The extension opening 402 may extend through the passivation layer 304 and down to the barrier layer 302. Also, the extension opening 402 can be formed according to a predetermined shape (e.g., a cylindrical opening with a circular/oval cross-sectional shape or a polygonal cross-sectional shape) and/or a corresponding location.

Figure 5:
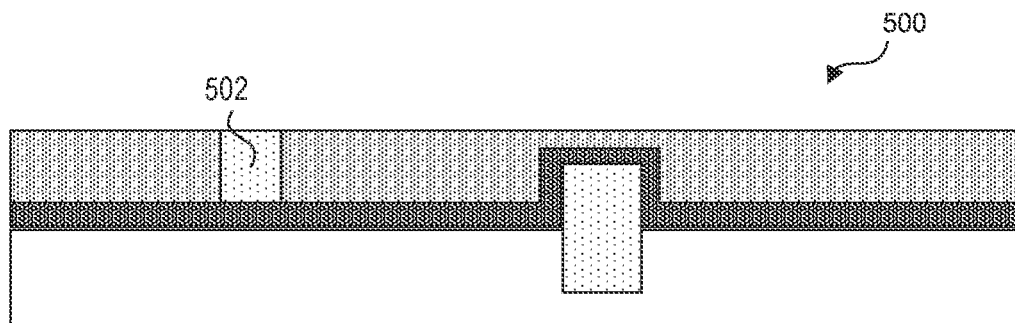

FIG. 5 illustrates an intermediate structure 500 having the structure 400 of FIG. 4 with an extension structure 502 in each of the extension openings 402 of FIG. 4. The extension structure 502 can correspond to the electrically-isolated extension 122 of FIG. 1B. The extension structure 502 may be formed according to metal deposition or plating techniques. The extension structure 502 can occupy the extension openings 402 and have the shape associated with the extension opening 402.

In some embodiments, the manufacturing process can iteratively repeat one or more processes associated with FIG.

3-FIG. 5. For example, the passivation layer 304 may be deposited or formed around the extension opening 402. The extension opening 402 can be preserved or formed using a barrier or through controlling the deposition of the passivation layer 304. Also, the passivation layer 304 and the extension structure 502 may be formed iteratively. For each iteration, a portion of the passivation layer 304 may be formed and a portion of the extension structure 502 may be deposited afterwards into the extension opening 402. The iterative forming may be used to control patterns, shapes, and/or orientation of the extension structure 502, such as by controlling and varying the size, location, and/or shape of the extension opening 402 across the iterations. Accordingly, the extension structure 502 can have a non-rectangular side-view shape, non-reflective shape across one or more axes, laterally extending portions, multiple internal members or portions, and/or separation spaces between internal members. In other embodiments, the extension structure 502 may be placed at a predetermined location after forming the barrier layer 302, and the passivation layer 304 may be formed around the extension structure (such as by, e.g., flowing and curing passivation or epoxy material).

Figure 6:
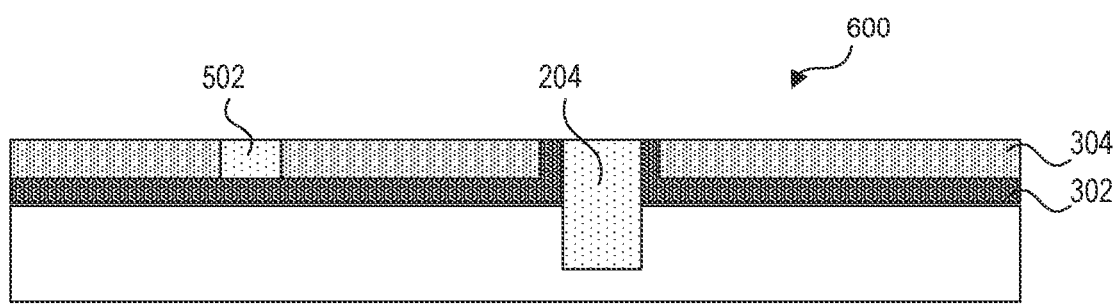

FIG. 6 can illustrate an intermediate structure 600 corresponding to the structure 500 of FIG. 5 with a top portion thereof removed. For example, the manufacturing process can include chemical and/or mechanical removal processes (e.g., cutting, grinding, chemical-mechanical polishing (CMP), etc.) to remove a portion of the passivation layer 304, the extension structure 502, the TSV structure 204, and/or the barrier layer 302 (e.g., the portion over the TSV structure 204). As a result, the intermediate structure 600 can have the TSV structure 204 exposed on or through a top surface thereof. In some embodiments, the intermediate structure 600 can have a planar surface. In other words, top surfaces of the passivation layer 304, the TSV structure 204, and/or the extension structure 502 may be coplanar. Further, the TSV structure 204 may be located within an opening in the passivation layer 304. The barrier layer 302 may also be located within the opening, with the barrier layer 302 contacting/surrounding the TSV structure 204. Based on the removal, the electrically-isolated extension 122 of FIG. 1B may be formed from the extension structure 502, and the TSV 132 of FIG. 1B may be formed from the TSV structure 204.

Figure 7:
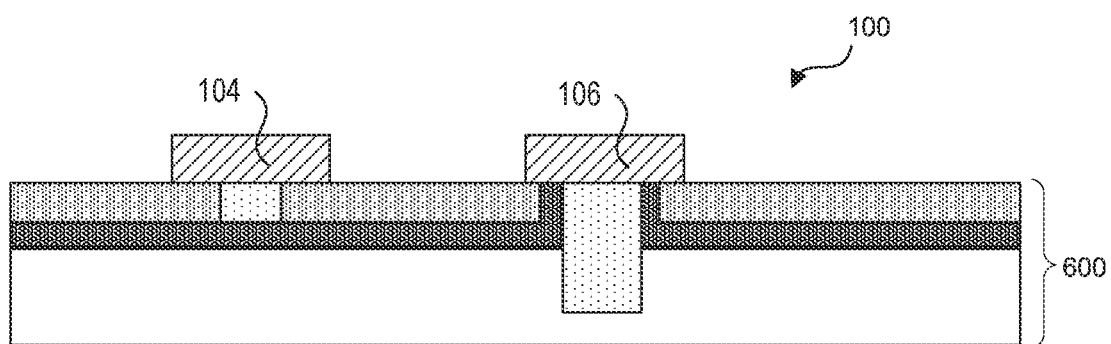

FIG. 7 can illustrate the intermediate structure 600 with the set of pads (UBM) mounted thereon. The set of pads (e.g., the thermal pad 104 and/or the electrical pad 106) may be mounted over the remaining/exposed extension structure 502 of FIG. 6 and/or the TSV structure 204 of FIG. 6. The pads may be mounted based on bonding and/or attaching (via, e.g., adhesives) the set of pads to the corresponding extension structure 502 and/or TSV structure 204. The apparatus 100 of FIG. 1A may be formed based on mounting the set of pads to the intermediate structure 600.

Figure 8A:
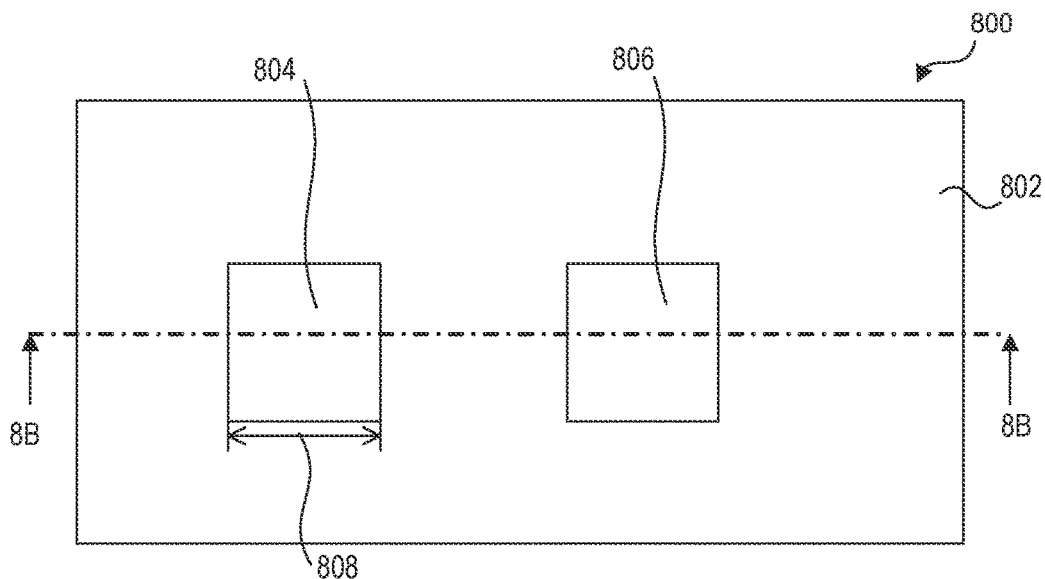
FIG. 8A-FIG. 8C illustrate a second example apparatus in accordance with embodiments of the technology.
Figure 8B:
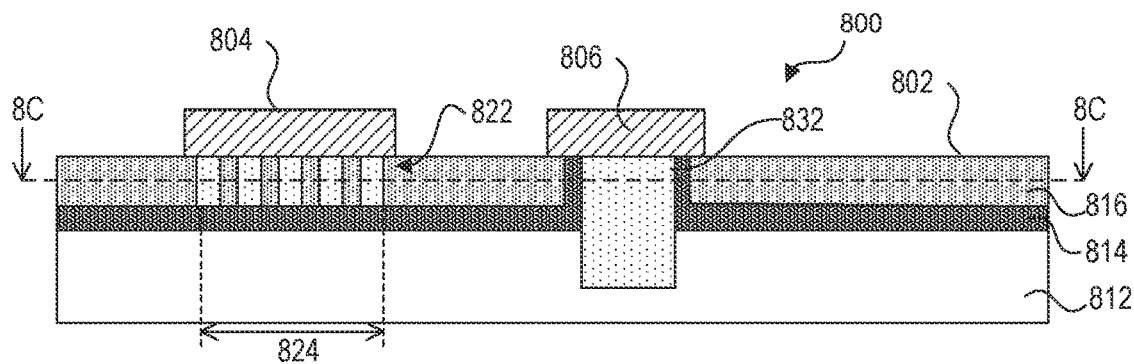
Figure 8C:
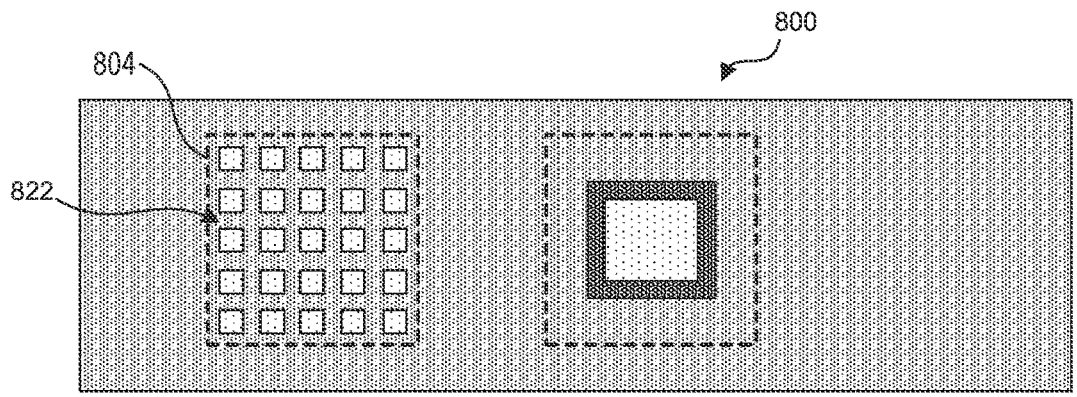

FIG. 8A-FIG. 8C illustrate a second example apparatus 800 (e.g., a semiconductor device, such as a chip, a package, and/or an assembly) in accordance with embodiments of the technology. FIG. 8A can illustrate a bottom view of the apparatus 800, FIG. 8B can illustrate a cross-section view of the apparatus 800 taken along a line 8B-8B of FIG. 8A, and FIG. 8C can illustrate a cross-section view of the apparatus 800 taken along a line 8C-8C of FIG. 8B.

The apparatus 800 can be similar to the apparatus 100 of FIG. 1A. Referring to FIG. 8A and FIG. 8B together, the apparatus 800 can include a surface 802 (e.g., a bottom surface) with a set of connection pads (e.g., UBMs), such as a thermal pad 804 and/or an electrical pad 806 exposed/mounted thereon. The apparatus 800 can have a substrate 812 (e.g., a wafer substrate, such as a silicon substrate). The apparatus 800 can have a barrier layer 814 (e.g., a SiN layer) disposed between the substrate 812 and a passivation layer 816 (e.g., a TEOS layer). The apparatus 800 can further include a TSV 832. The substrate 812, the barrier layer 814, the TSV 832, and the passivation layer 816 can be similar in material, shape, location, orientation, or the like to the corresponding structures of the apparatus 100.

The apparatus 800 can include a set of electrically-isolated extensions 822 each for one or more of the pads (e.g., one or more of the thermal pads 804). For example, each set of electrically-isolated extensions 822 can be directly coupled (via, e.g., direct contact or an attachment mechanism, such as a thermally conductive adhesive) to one of the thermal pads 804. Each set of electrically-isolated extensions 822 can include two or more structures (e.g., pins, pegs, etc.) overlapped by and extending from the corresponding pad toward the substrate 812. The structures within each set of electrically-isolated extensions 822 can be arranged according to a predetermined pattern and have corresponding separation distances/spaces between pairs of adjacent structures. Each structure can have a predetermined shape (e.g., the cross-sectional shape and/or the side-view shape) that corresponds to the manufacturing process (e.g., the extension opening 402 of FIG. 4 and/or the iterative process described above). In some embodiments, the set of electrically-isolated extensions 822 can have lengths that corresponds to the extension length 126 of FIG. 1B.

The set of electrically-isolated extensions 822 can have an extension width 824 that corresponds to a distance between opposing surfaces of structures located on opposing ends of the arrangement. The extension width 824 can be less than the pad width 808 and correspond to the extension width 124 of FIG. 1B. In some embodiments, the apparatus 800 can include the set of electrically-isolated extensions 822 that match or correspond to the electrically-isolated extension 122 of FIG. 1B for the apparatus 100 of FIG. 1.

Figure 9A:
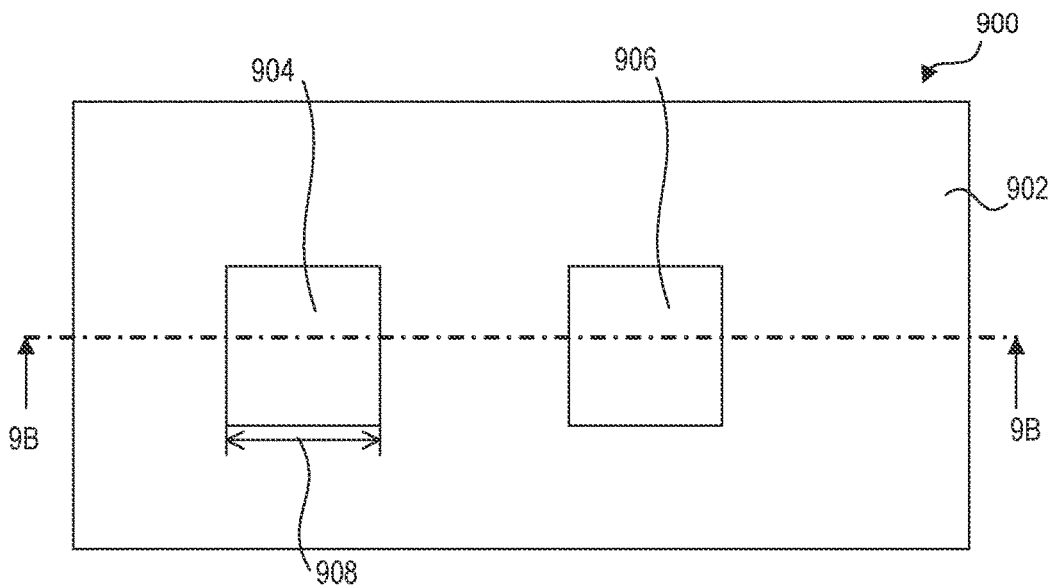
FIG. 9A-FIG. 9C illustrate a third example apparatus in accordance with embodiments of the technology.
Figure 9B:
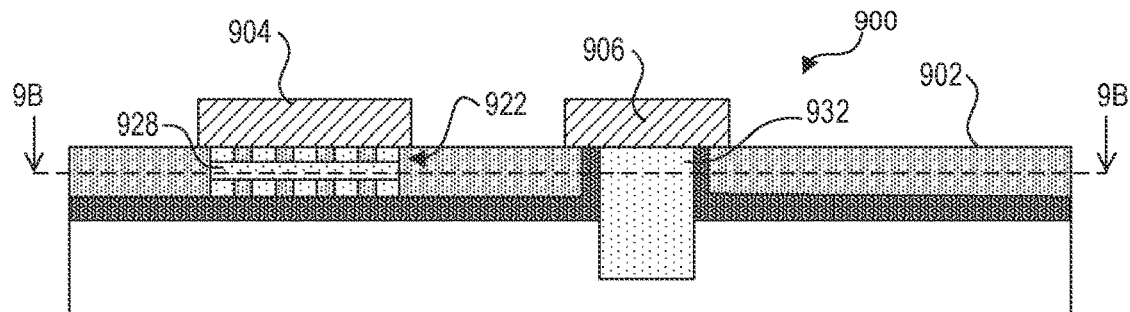
Figure 9C:
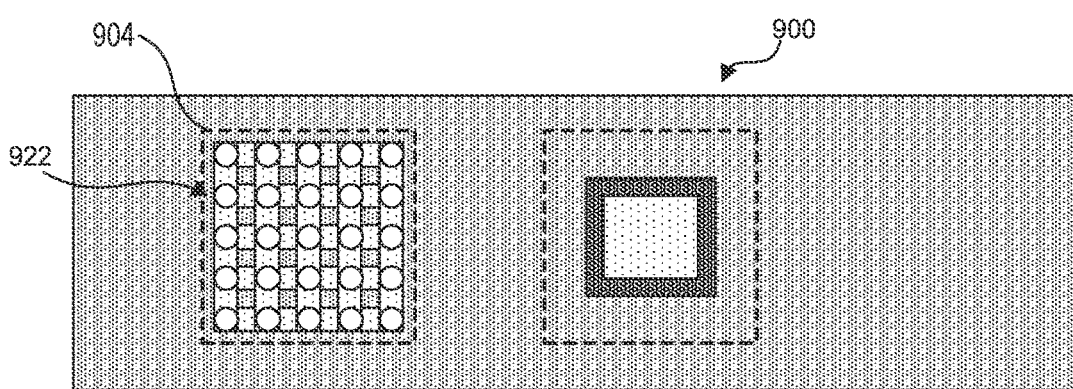

FIG. 9A-FIG. 9C illustrate a third example apparatus 900 (e.g., a semiconductor device, such as a chip, a package, and/or an assembly) in accordance with embodiments of the technology. FIG. 9A can illustrate a bottom view of the apparatus 900, FIG. 9B can illustrate a cross-section view of the apparatus 900 taken along a line 9B-9B of FIG. 9A, and FIG. 9C can illustrate a cross-section view of the apparatus 900 taken along a line 9C-9C of FIG. 9B.

The apparatus 900 can be similar to the apparatus 100 of FIG. 1A. Referring to FIG. 9A and FIG. 9B together, the apparatus 900 can include a surface 902 (e.g., a bottom surface) with a set of connection pads (e.g., UBMs), such as a thermal pad 904 and/or an electrical pad 906 exposed/mounted thereon. The apparatus 900 can have a substrate 912 (e.g., a wafer substrate, such as a silicon substrate). The apparatus 900 can have a barrier layer 914 (e.g., a SiN layer) disposed between the substrate 912 and a passivation layer 916 (e.g., a TEOS layer). The apparatus 900 can further include a TSV 932. The substrate 912, the barrier layer 914, the TSV 932, and the passivation layer 916 can be similar in material, shape, location, orientation, or the like to the corresponding structures of the apparatus 100 and/or the apparatus 800 of FIG. 8A.

The apparatus 900 can include a set of electrically-isolated extensions 922 each for one or more of the pads (e.g., one or more of the thermal pads 904). For example, each set of electrically-isolated extensions 922 can be directly coupled (via, e.g., direct contact or an attachment mechanism, such as a thermally conductive adhesive) to one of the thermal pads 904. Each set of electrically-isolated extensions 922 can include two or more structures (e.g., pins, pegs, etc.) overlapped by and extending from the corresponding pad toward the substrate 912. The structures within each set of electrically-isolated extensions 922 can be arranged according to a predetermined pattern and have corresponding separation distances/spaces between pairs of adjacent structures. Each structure can have a predetermined shape (e.g., the cross-sectional shape and/or the side-view shape) that corresponds to the manufacturing process (e.g., the extension opening 402 of FIG. 4 and/or the iterative process described above). In some embodiments, the set of electrically-isolated extensions 922 can have lengths that corresponds to the extension length 126 of FIG. 1B.

The set of electrically-isolated extensions 922 can have an extension width 924 that corresponds to a distance between opposing surfaces of structures located on opposing ends of the arrangement. The extension width 924 can be less than the pad width 908 and correspond to the extension width 124 of FIG. 1B. In some embodiments, the apparatus 900 can include the set of electrically-isolated extensions 922 that match or correspond to the electrically-isolated extension 122 of FIG. 1B for the apparatus 100 of FIG. 1.

In some embodiments, the set of electrically-isolated extensions 922 can include one or more cross-linking structures 928 connected to or integral with one or more of the vertically-extending structures. The cross-linking structures 928 can extend along a lateral direction. The cross-linking structures 928 can be located between the surface 902 and the substrate 912. For example, the cross-linking structures 928 can extend horizontally and connect to the down-ward extension structures at 90° angles. The cross-linking structures 928 can be embedded in and directly contact the passivation layer 916. In some embodiments, the cross-linking structures 928 can be a mesh structure, and the vertical structures can connect to the joint portions in the mesh.

Figure 10:
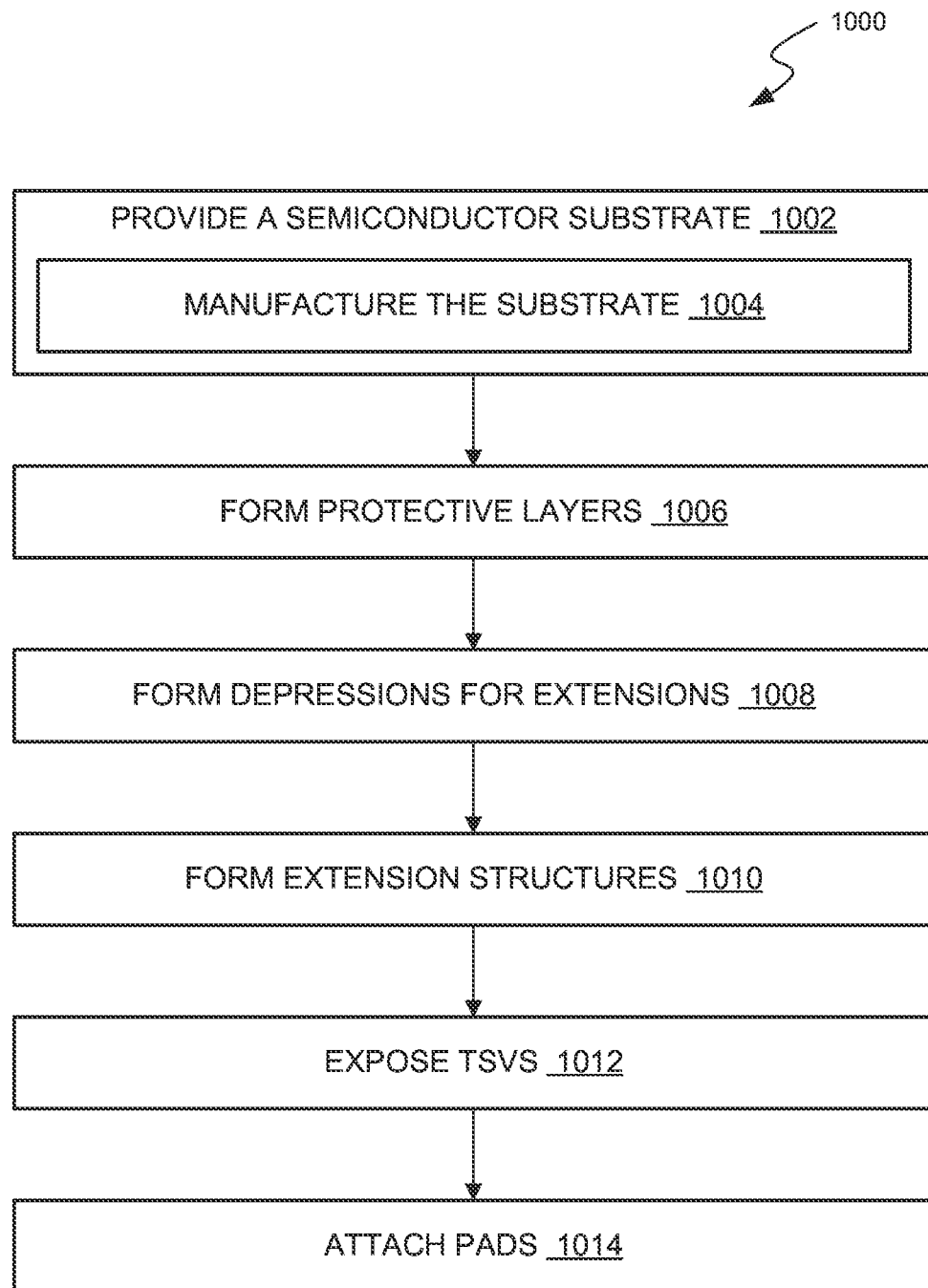
FIG. 10 is a flow diagram illustrating an example method of manufacturing an apparatus in accordance with an embodiment of the present technology.

FIG. 10 is a flow diagram illustrating an example method 1000 of manufacturing an apparatus (e.g., the apparatus 100 of FIG. 1A, the apparatus 800 of FIG. 8A, and/or the apparatus 900 of FIG. 9A) in accordance with an embodiment of the present technology. The method 1000 can include forming the electrically-isolated extension 122 of FIG. 1B.

At block 1002, the method 1000 can include providing a semiconductor substrate (e.g., the substrate 112 of FIG. 1B, such as the wafer-level substrate 202 of FIG. 2). The substrate 112 can correspond to a process associated with FIG. 2 and the structure 200 of FIG. 2. The provided substrate may include the TSV structure 204 of FIG. 2 as described above. In some embodiments, providing the substrate 112 may include manufacturing the wafer-level substrate 202 as illustrated at block 1004, such as through semiconductor manufacturing processes (e.g., doping, thinning, or the like).

At block 1006, the method 1000 can include forming protective layers. For example, forming the protective layers may include forming the barrier layer 302 of FIG. 3 and/or the passivation layer 304 of FIG. 3 over the substrate 112 (e.g., the wafer-level substrate 202 of FIG. 2 and/or the uncovered surface 212 of FIG. 2). The protective layers may be formed by depositing and/or laminating the layers over the substrate 112. Forming the protective layers can correspond to the processes associated with FIG. 3 and the structure 300 of FIG. 3.

At block 1008, the method 1000 can include forming depressions (e.g., the extension openings 402 of FIG. 4) in one or more of the protective layers for accommodating/forming extensions. For example, the extension openings 402 can be formed based on etching away or removing at least a portion of the passivation layer 304, a portion of the barrier layer 302, and/or a portion of the wafer-level substrate 202. Forming the depressions can correspond to a process associated with FIG. 4 and the structure 400 of FIG. 4.

At block 1010, the method 1000 can include forming extension structures. For example, the extension structures 502 of FIG. 5 may be formed in the extension openings 402, such as by depositing or plating thermally-conductive material (e.g., metallic material) in the extension openings 402. Forming the extensions can correspond to a process associated with FIG. 5 and structure 500 of FIG. 5.

In some embodiments, such as illustrated at block 1012, the method 1000 can include exposing the TSVs. A portion of the structure 500 may be removed to expose the extension structures 502. For example, a portion of the passivation layer 304, a portion of the extension structure 502, a portion of the TSV structure 204, and/or a portion of the barrier layer 302 (e.g., the portion over and/or adjacent to the TSV structure 204) by a chemical-mechanical polishing (CMP) process. Accordingly, exposing the TSVs can correspond to a planarization process associated with FIG. 6 and structure 600 of FIG. 6.

At block 1014, the method 1000 can include attaching the connection pads (e.g., UBMs), such as the electrical pads 106 FIG. 1A and/or the thermal pads 104 of FIG. 1A. The connection pads may be attached to/over the planarized surface (e.g., the surface 102 of FIG. 1A). The thermal pads 104 can be coupled (e.g., thermally coupled) or directly attached to the extension structures 502 (e.g., the electrically-isolated extensions 122), and the electrical pads 106 can be coupled (e.g., electrically coupled) or directly attached to the TSV structures 204 (e.g., the TSVs 132).

The electrically-isolated extensions 122 can provide increased stress relief on the passivation layer 304, such as underneath the corresponding pad. The increased stress relief can prevent structural damages (e.g., cracks) in the passivation layer 304 and/or other structures in the apparatus. Moreover, the electrically-isolated extensions 122 can be formed based on leveraging existing processes (e.g., without increasing manufacturing complexities).

Figure 11:
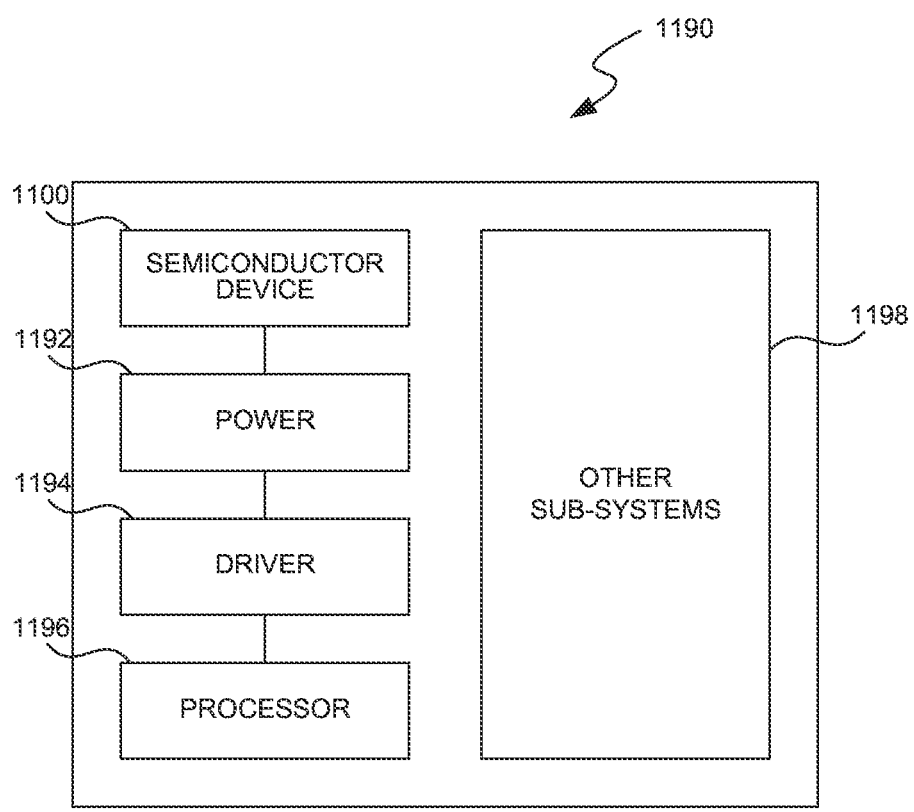
FIG. 11 is a schematic view of a system that includes an apparatus configured in accordance with embodiments of the present technology.

FIG. 11 is a schematic view of a system that includes an apparatus in accordance with embodiments of the present technology. Any one of the semiconductor devices described above with reference to FIGS. 1A-10 can be incorporated into any of a myriad of larger and/or more complex systems, a representative example of which is system 1190 shown schematically in FIG. 11. The system 1190 can include a semiconductor device 1100 ("device 1100") (e.g., a semiconductor device, package, and/or assembly), a power source 1192, a driver 1194, a processor 1196, and/or other subsystems or components 1198. The device 1100 can include features generally similar to those devices described above. The resulting system 1190 can perform any of a wide variety of functions, such as memory storage, data processing, and/or other suitable functions. Accordingly, representative systems 1190 can include, without limitation, handheld devices (e.g., mobile phones, tablets, digital readers, and digital audio players), computers, and appliances. Components of the system 1190 may be housed in a single unit or distributed over multiple, interconnected units (e.g., through a communications network). The components of the system 1190 can also include remote devices and any of a wide variety of computer-readable media.

This disclosure is not intended to be exhaustive or to limit the present technology to the precise forms disclosed herein. Although specific embodiments are disclosed herein for illustrative purposes, various equivalent modifications are possible without deviating from the present technology, as those of ordinary skill in the relevant art will recognize. In some cases, well-known structures and functions have not been shown or described in detail to avoid unnecessarily obscuring the description of the embodiments of the present technology. Although steps of methods may be presented herein in a particular order, alternative embodiments may perform the steps in a different order. Similarly, certain aspects of the present technology disclosed in the context of particular embodiments can be combined or eliminated in other embodiments. Furthermore, while advantages associated with certain embodiments of the present technology may have been disclosed in the context of those embodiments, other embodiments can also exhibit such advantages, and not all embodiments need necessarily exhibit such advantages or other advantages disclosed herein to fall within the scope of the technology. Accordingly, the disclosure and associated technology can encompass other embodiments not expressly shown or described herein, and the invention is not limited except as by the appended claims.

Throughout this disclosure, the singular terms "a," "an," and "the" include plural referents unless the context clearly indicates otherwise. Similarly, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Additionally, the terms "comprising," "including," and "having" are used throughout to mean including at least the recited feature(s) such that any greater number of the same feature and/or additional types of other features are not precluded. Reference herein to "one embodiment," "an embodiment," "some embodiments" or similar formulations means that a particular feature, structure, operation, or characteristic described in connection with the embodiment can be included in at least one embodiment of the present technology. Thus, the appearances of such phrases or formulations herein are not necessarily all referring to the same embodiment. Furthermore, various particular features, structures, operations, or characteristics may be combined in any suitable manner in one or more embodiments.

What is claimed is:

1. An apparatus, comprising:
   a semiconductor substrate, wherein the semiconductor substrate corresponds to a semiconductor wafer and the semiconductor substrate includes electrical circuit components;
   a passivation layer covering a backside of the semiconductor substrate, wherein at least a portion of a surface of the passivation layer comprises a surface of the semiconductor substrate;
   a connection pad disposed over the passivation layer of the semiconductor substrate; and
   an extension directly coupled to the connection pad and extending from the connection pad into the passivation layer, wherein the extension and the connection pad are electrically isolated from the electrical circuit components of the semiconductor substrate.

2. The apparatus of claim 1, wherein the extension extends into the passivation layer by a length less than a distance between a surface of the passivation layer and the semiconductor substrate.

3. The apparatus of claim 1, wherein the extension has a length less than or equal to a thickness of the passivation layer.

4. The apparatus of claim 3, wherein the passivation layer includes a tetraethyl orthosilicate (TEOS) layer.

5. The apparatus of claim 1, further comprising:
   a barrier layer disposed between the passivation layer and the semiconductor substrate;
   wherein
   the extension extends at least through the passivation layer to the barrier layer.

6. The apparatus of claim 5, wherein the extension extends at least partially through the barrier layer.

7. The apparatus of claim 5, wherein the barrier layer comprises SiN.

8. The apparatus of claim 1, wherein the connection pad is a first connection pad, and further comprising:
   a second connection pad disposed over the passivation layer; and
   a through silicon via (TSV) directly coupled to the second connection pad and extending from the second connection pad through the passivation layer and into the semiconductor substrate,
   wherein
   the extension has a first length less than a second length of the TSV.

9. The apparatus of claim 1, wherein the extension includes a thermally conductive material and is thermally coupled to the connection pad.

10. The apparatus of claim 9, wherein the connection pad is a thermal pad configured to provide an external interface for removing thermal energy away from the semiconductor substrate.

11. The apparatus of claim 1, wherein:
    the connection pad has a first width; and
    the extension has a second width less than the first width.

12. The apparatus of claim 1, wherein the extension is one extension within a set of extensions, extensions in the set of electrically-isolated extensions being:
    directly coupled to the connection pad,
    separated from each other by at least a separation distance,
    covered by the connection pad, and
    electrically isolated from the semiconductor substrate.

13. The apparatus of claim 12, wherein the set of extensions includes at least one cross-linking structure extending between and connected to at least two adjacent extensions of the set.

14. A semiconductor device, comprising:
    a semiconductor substrate, wherein the semiconductor substrate corresponds to a semiconductor wafer and the semiconductor substrate includes electrical circuit components;
    an active circuitry formed on a frontside of the semiconductor substrate;
    an electrical pad over a backside of the semiconductor substrate and electrically coupled to the active circuitry, wherein the electrical pad is configured to provide an external electrical interface for the active circuitry in the semiconductor device;
    a thermal pad over the backside to the semiconductor substrate and electrically isolated from the active circuitry and the semiconductor substrate, wherein the thermal pad is configured to provide an external thermal interface for removing thermal energy from the semiconductor device; and an extension coupled to the thermal pad and extending from the thermal pad and toward an inner portion of the semiconductor substrate, wherein the extension is electrically isolated from the active circuitry and the electrical circuit components of the semiconductor substrate.

15. The semiconductor device of claim 14, further comprising:

an outer protective layer covering the semiconductor substrate;

a barrier layer disposed between the outer protective layer and the semiconductor substrate;

wherein the electrical pad and the thermal pad are attached over the outer protective layer and the semiconductor substrate; and the extension extends at least partially through the outer protective layer.

16. The semiconductor device of claim 15, wherein:

the outer protective layer includes a tetraethyl orthosilicate (TEOS) layer; and the extension extends through the TEOS layer and up to the barrier layer.

17. The semiconductor device of claim 14, further comprising:

a through silicon via (TSV) electrically coupled to the electrical pad and the active circuitry, the TSV having a TSV length that is greater than a length of the electrically-isolated extension.

18. The semiconductor device of claim 14, the extension is one vertical extension within a set of vertical extensions, vertical extensions in the set of vertical extensions being:

directly attached to the thermal pad, separated from each other by at least a lateral separation distance, arranged within an area under the thermal pad and having a width less than a width of the connection pad, and electrically isolated from the active circuitry and the semiconductor circuitry.

19. A method of manufacturing a semiconductor device, the method comprising:

providing a semiconductor substrate having active circuitry on a frontside of the semiconductor substrate, where the semiconductor substrate includes electrical circuit components;

forming a protective outer layer over a backside of the semiconductor substrate;

forming a depression extending at least partially through the protective outer layer and toward the semiconductor substrate;

forming an electrically-isolated extension in the depression, wherein the electrically-isolated extension is electrically isolated from the active circuitry and the electrical circuit components of the semiconductor substrate; and attaching a connection pad over the protective outer layer and coupled to the electrically-isolated extension.

20. The method of claim 19, further comprising:

forming a barrier layer over the semiconductor substrate and a through-silicon via (TSV) before forming the protective outer layer;

removing a portion of the barrier layer, a portion of the protective outer layer, a portion of the electrically-isolated extension, or a combination thereof to expose the TSV;

attaching an electrical pad attached to the TSV;

wherein:

the connection pad is a thermal pad configured to provide an external thermal interface for removing thermal energy from the semiconductor device;

the electrically-isolated extension includes a thermally conductive material and is thermally coupled to the thermal pad; and the protective outer layer is formed over the barrier layer and covers the TSV.

* * * * *